United States Patent
Guern

(10) Patent No.: US 9,392,704 B2
(45) Date of Patent: Jul. 12, 2016

(54) METHOD OF PRODUCING RESONANT PATTERNS ADAPTED TO THE IMPLEMENTATION OF RF PASSIVE FUNCTIONS

(71) Applicant: THALES, Neuilly-sur-Seine (FR)

(72) Inventor: Pierre Guern, Cholet (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 14/103,754

(22) Filed: Dec. 11, 2013

(65) Prior Publication Data

US 2014/0158402 A1 Jun. 12, 2014

(30) Foreign Application Priority Data

Dec. 12, 2012 (FR) ...................... 12 03378

(51) Int. Cl.
*H01Q 7/00* (2006.01)
*H05K 3/40* (2006.01)
*H05K 1/16* (2006.01)
*H05K 3/00* (2006.01)

(52) U.S. Cl.
CPC ............. *H05K 3/4038* (2013.01); *H05K 1/16* (2013.01); *H05K 1/165* (2013.01); *H05K 3/0044* (2013.01); *H01L 2924/0002* (2013.01); *H05K 2201/09063* (2013.01); *H05K 2203/0228* (2013.01); *Y10T 29/49155* (2015.01)

(58) Field of Classification Search
CPC ... G06K 19/0672; H01F 41/045; H01L 27/01

USPC ............... 29/600, 592.1, 830–831, 846–847, 29/700 MS, 786
See application file for complete search history.

(56) References Cited

U.S. PATENT DOCUMENTS

| | | | |
|---|---|---|---|
| 3,102,213 A | | 8/1963 | Bedson et al. |
| 4,609,892 A | * | 9/1986 | Higgins, Jr. ................... 333/204 |
| 5,373,112 A | | 12/1994 | Kamimura et al. |
| 5,539,241 A | | 7/1996 | Abidi et al. |
| 5,874,883 A | * | 2/1999 | Uemura et al. ............... 336/200 |
| 6,189,201 B1 | * | 2/2001 | Trzaskowski et al. ........ 29/602.1 |
| 7,930,815 B2 | * | 4/2011 | Coleman et al. ................ 29/600 |
| 2005/0225420 A1 | | 10/2005 | Chen |
| 2006/0017527 A1 | | 1/2006 | Kanno et al. |
| 2007/0169336 A1 | * | 7/2007 | Luch ............................... 29/601 |
| 2011/0227689 A1 | * | 9/2011 | Chang et al. ................... 336/200 |
| 2014/0158402 A1 | * | 6/2014 | Guern .......................... 174/250 |

FOREIGN PATENT DOCUMENTS

| | | |
|---|---|---|
| EP | 0969509 A1 | 1/2000 |
| EP | 1367668 A1 | 12/2003 |
| GB | 800064 | 8/1958 |

* cited by examiner

*Primary Examiner* — Minh Trinh
(74) *Attorney, Agent, or Firm* — Baker & Hostetler LLP

(57) ABSTRACT

A method for producing one or more radio-frequency resonant patterns on a printed circuit includes a step of cutting one or more resonant patterns directly into the printed circuit while preserving means for mechanically securing the resonant patterns to said printed circuit. The method may be applied to the production of filters.

3 Claims, 2 Drawing Sheets

METHOD OF PRODUCING RESONANT PATTERNS ADAPTED TO THE IMPLEMENTATION OF RF PASSIVE FUNCTIONS

CROSS-REFERENCE TO RELATED APPLICATION

This application claims priority to foreign French patent application No. FR 1203378, filed on Dec. 12, 2012, the disclosure of which is incorporated by reference in its entirety.

FIELD OF THE INVENTION

The subject matter of the invention concerns a method for producing one or more radio-frequency resonant patterns adapted to the implementation of RF passive functions. The invention finds its application notably for producing filters tuneable electrically.

BACKGROUND

The resonant patterns of radio-frequency (RF) passive functions, often consisting of assemblies of coils and capacitors for frequencies of less than 1 GHz, may be glued, screwed or soldered to the printed circuit. This latter situation is the most frequent; an inductor will be connected by soldering it to the printed circuit, for example.

The patterns may also be etched, most often by chemical etching, into the conductive layers of the printed circuit. This is the technique the most widely adopted for producing microwave resonant circuits, for frequencies of greater than 1 GHz. Thus it is known to implement by chemical etching passive functions (filters, couplers, resonators) on the printed circuit (microstrip technology) or in the printed circuit (stripline technology).

The standard technologies used for "tuneable" filter functions for frequencies of less than 1 GHz are most often based on the use of inductors of helical shape necessitating the use of high-precision mechanical components leading to high costs and despite all this a tolerance on the value obtained that often necessitates an adjustment phase after manufacture, either by adaptation of the inductor itself or by changing values of surrounding components such as the capacitors.

As a general rule, RF power equipment is of reducing cost and overall size, for ever increasing requirements in respect of reliability. Also, this RF equipment is increasingly constituted of a stack of cards, and therefore of somewhat plane mechanical structures.

There therefore exists at present a requirement for printed circuits implementing different functions, including filter functions, the printed circuits complying with criteria of small thickness, high performance and low induced costs as well as of technically easy manufacture.

SUMMARY OF THE INVENTION

The idea on which the invention is based relies notably on the use of the printed circuit and the production techniques associated with the manufacture thereof not simply to support components but so that the circuit itself implements a certain number of functions. The circuit is no longer used as a simple support on which components are placed, soldered or interconnected.

The invention concerns a method for producing one or more radio-frequency resonant patterns on a printed circuit characterized in that it includes at least a step of cutting one or more patterns directly into the printed circuit whilst preserving means for mechanically securing the resonant patterns to said printed circuit.

The invention also concerns a method for manufacturing one or more radio-frequency resonant patterns on a printed circuit comprising a plurality of layers characterized in that it includes in combination at least the following steps:
a) the internal layers of the multilayer printed circuit are chemically etched, after which the printed circuit is pressed,
b) a plurality of holes is produced necessary for producing conductive metalized vias,
c) the metalized vias are metalized,
d) the external layers of said printed circuit are chemically etched,
e) one or more of the following are produced by milling: external cutting of the printed circuit, or of the internal contours, or of one or more resonant patterns, leaving means for mechanically securing the resonant patterns relative to the printed circuit.

The contours of the resonant patterns may be milled and the edge surfaces may be metalized simultaneously during the step b), for example.

The method may be used for the production of resonant patterns of diverse shapes, bars and spirals.

The method described hereinafter may be used for the production of high-frequency planar filters operating in the band 10 MHz to 10 GHz.

The invention further concerns a printed circuit including one or more resonant patterns produced using the method.

BRIEF DESCRIPTION OF THE DRAWINGS

Other features and advantages of the device in accordance with the invention will become more apparent on reading the following description of an embodiment provided by way of illustration and in no way limiting on the invention with the appended figures, in which.

DETAILED DESCRIPTION

Figure 1:
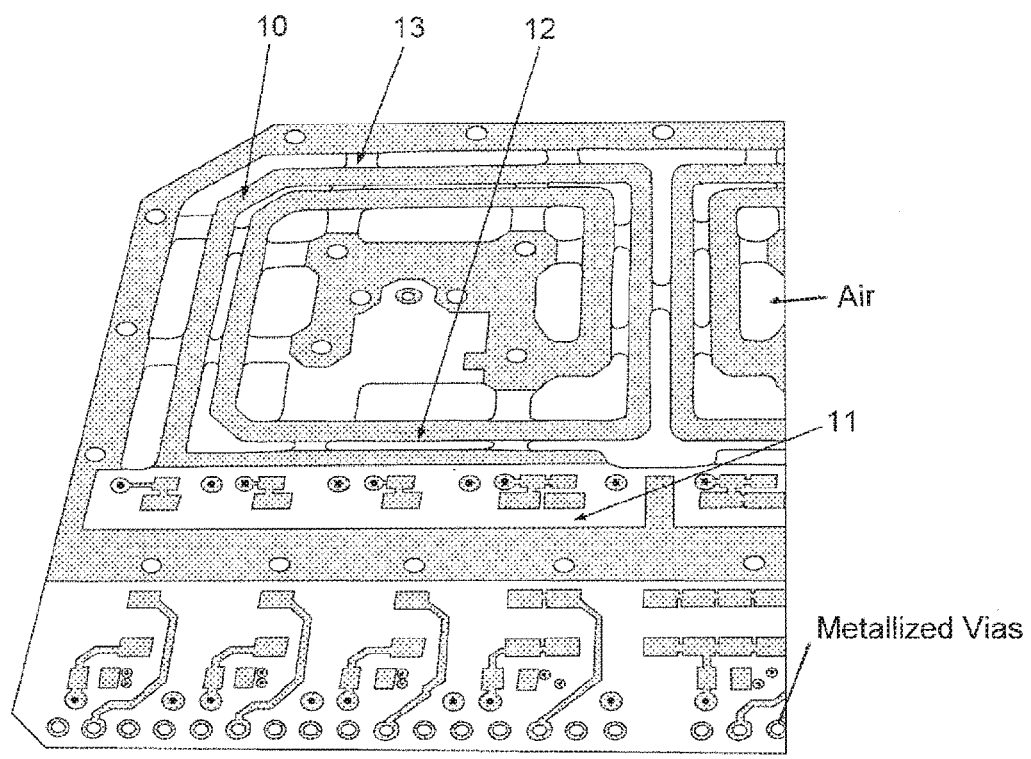
FIG. 1 shows an example of a product obtained using the method in accordance with the invention.

The method in accordance with the invention is notably based on the implementation on a printed circuit of passive functions floating in the air by direct machining of the contour of one or more resonant patterns in the printed circuit. The passive functions are implemented using resonant patterns the appropriate external contours of which are produced in the printed circuit. The resonant pattern produced in this way is not carried by the printed circuit but forms part of it. It is produced by milling or cutting the supporting printed circuit. It is characterized from an electromagnetic point of view by the fact that the dielectric of the pattern is almost entirely air.

The printed circuit may be a single-layer or multi-layer circuit or any other available type of printed circuit.

In accordance with one embodiment, the resonant pattern will have the edge surface or surfaces metalized to improve its conductivity.

If the printed circuit used comprises a plurality of layers, the production of resonant patterns will include the following steps, for example:
a) any internal layers of the possibly multilayer printed circuit are chemically etched using a process known to the person skilled in the art; after etching any internal layers, the printed circuit is then pressed, which consists in bonding the different layers together; at this stage the external layers have not yet been etched, b) there then follows a drilling sequence in which the holes are produced necessary for producing conductive metalized vias; the printed circuit is cut internally or externally at this stage if the cut edge surfaces are to be metalized; the contours of the resonant pattern or patterns may be produced by milling at this stage if the edge surfaces of the resonant pattern are to be metalized; if the edge surfaces are not to be metalized, the step of milling the contours of the resonant patterns may be carried out at the end of the manufacturing process; non-milled portions are nevertheless left as mechanical supports for the patterns, c) the metalized vias are metalized and at the same time the edge surfaces of the contours of the resonant patterns, d) any chemical etching of the external layers is effected, e) the external cutting of the printed circuit or of the internal contours or of the external contours of the resonant pattern is effected by milling if metalized edge surfaces of these patterns are not required or if this metallization is to be removed locally.

The resonant pattern produced in accordance with the invention may be relatively complex and the production accuracy is of the order of +/−0.1 mm, for example. The minimum width of the cuts produced by milling depends on the milling tool used and the milling tool is chosen notably as a function of the thickness of the printed circuit. It may be locally reduced to less than one millimeter for a standard printed circuit thickness of 1.6 millimeters.

The milling of the printed circuit enables production of internal cuts in order to produce the required patterns with respect to a required device or to cut the external contour of the printed circuit.

The edge surfaces or the edges of the cuts are metalized by a technique known to the person skilled in the art, similar to the metallization of the metalized vias. There is therefore no high induced additional cost for the printed circuit, compared to other processes for producing resonant patterns such as the attachment of "mechanical" parts or components.

FIG. 1 represents one embodiment of a filter produced by the method of producing patterns in the printed circuit. The example given concerns the production of inductors, resonant patterns of a tuneable filter incorporated in the printed circuit of an RF function.

The contours of the inductive resonant pattern or patterns 10 have been milled directly into the printed circuit 11. The edge surfaces of the contours 12 have been metalized. The resonant pattern is therefore in large part in the air, retained by portions 13 of the printed circuit that have not been eliminated by the milling operation, which from the electromagnetic point of view offers the best performance in terms of losses and the lowest stray capacitances. These portions or tenons 13 of the circuit remaining after milling enable mechanical securing of the inductive resonant pattern 10.

The resonant patterns produced in this way are suitable for the production of RF passive functions.

One of the objectives of cutting a set of patterns into a printed circuit is for example to produce a filter that will be used in a communication system. The filter or filters produced by the production of patterns in accordance with the invention may be directly integrated into the printed circuit of the "radio front-end" function of the communication means, at the level of the various transmit or receive amplifier stages. In this example the principal function is high power level (1 to 50 W) filtering to enable operation of the radio set, in a situation where it is close to other sets, in the ultra-high frequency and very-high frequency (VUHF) band. From the functional point of view, in Receive mode, the filters function as protective filters in a situation of closeness of the Front end and protect the latter from powerful signals coming from the nearby collocated transmitter. In Transmit mode, they filter the signal emitted at a high level (1 W and 50 W) to limit the wide-band noise of the transmitter, which in a situation of closeness will interfere with nearby receivers.

The method described hereinafter is used to produce planar high-frequency filters operating in the 10 MHz to 1 GHz, or even 10 GHz, band.

Figure 2:
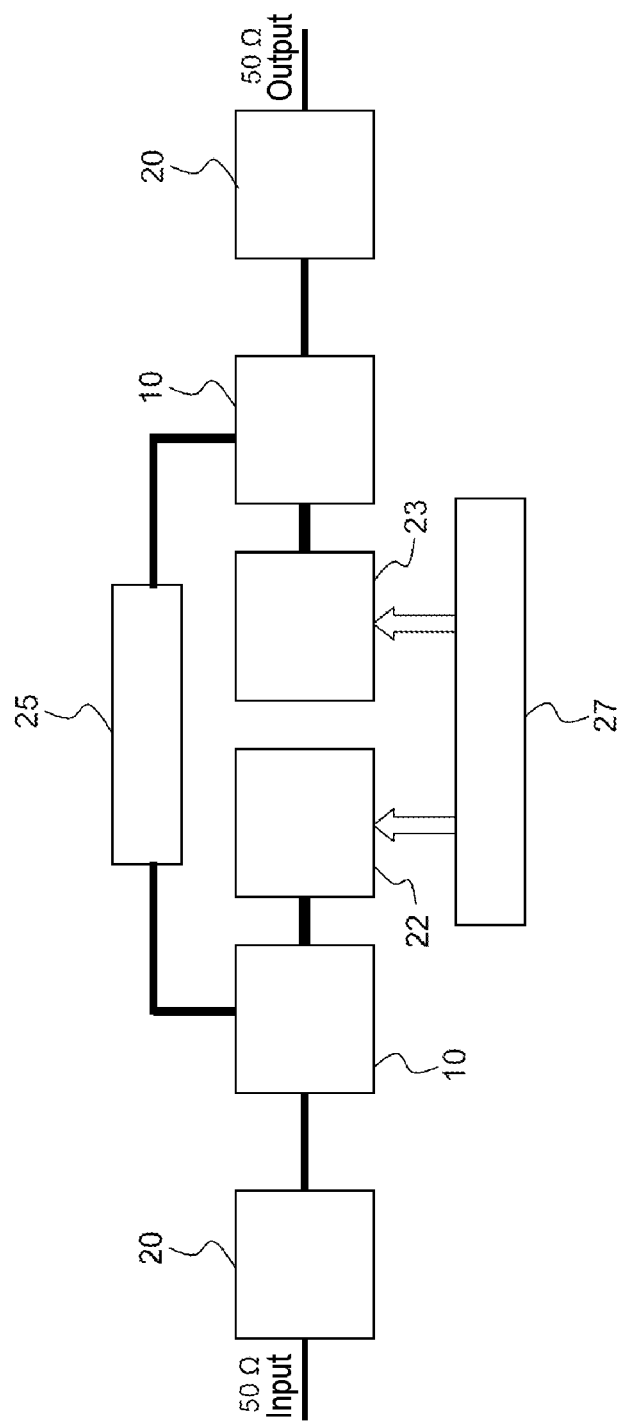
FIG. 2 shows an example of a communication device incorporating a filter produced using the method in accordance with the invention.

FIG. 2 represents an example of a filter produced by cutting patterns into a printed circuit as described above. The main part of the filter consists of two parallel oscillatory circuits consisting of two inductive resonant patterns 10 produced by milling the printed circuit. The patterns are tuned by capacitive weight boxes 22, 23 the variation of which enables frequency centring of the filter. An impedance matching function 20 provides the transition between the 50Ω interface and the load impedance of the OC (oscillatory circuit) that will fix the tuning of the filter in its pass-band. A controlled coupling network 25 between the two oscillatory circuits will enable the pass-band of the filter to be determined. A BUS management function 27 enables the capacitive weight boxes to be controlled on the basis of centre frequency information and time control signals.

Advantages

Without departing from the scope of the invention, it is possible to produce all shapes of patterns that will be chosen by the user according to the final function of the printed circuit and its use.

The patterns produced enabling the manufacture of developed electrically tuneable band-pass filters that have the following advantages:

- an excellent quality factor, enabling low-noise and/or high-power uses,
- very good control of coupling thanks to the dimensional precision and the possibility of milling complex shapes, and therefore good control of the pass-band of the filter within the agility band of the filter,
- the printed circuit including the tuneable filter or filters among other functions (amplification, RF switching) incorporate the resonant patterns but also all of the electronics and the control system necessary for use of the filter or filters, whence greatly facilitated mechanical assembly given that the general shape of the filter is plane.

The circuits produced by direct cutting of patterns into a printed circuit notably have the following advantages:

- good radio-frequency (RF) characteristics because the resonant patterns are almost entirely floating in air, which leads to low dielectric losses or even no losses and minimal stray capacitances,
- the possibility of producing numerous resonant pattern shapes,
- good production accuracy, of the order of +/−0.1 mm,
- very good reproducibility,
- a relatively vast field of application, for example, all applications requiring passive functions demanding very low losses or high powers at radio frequencies, from a few tens of MHz to several GHz,
- a plane mechanical configuration well suited to the current configuration of radio equipment, often constituted of a stack of cards and plane modules,
- de facto integration into a printed circuit able to carry other active or passive functions.

The invention claimed is:

1. A method for producing one or more radio-frequency resonant patterns on a multilayer printed circuit, comprising:
   preparing the multilayer printed circuit for chemical etching;
   chemically etching at least part of the multilayer printed circuit;
   pressing the multilayer printed circuit;
   drilling the multilayer printed circuit to produce a plurality of holes necessary for producing conductive metalized vias;
   machining the multilayer printed circuit to produce the one or more radio-frequency resonant patterns having contours on the multilayer printed circuit wherein a dielectric of the one or more radio-frequency resonant patterns is air;
   milling the contours of the one or more radio-frequency resonant patterns; and
   metallizing edge surfaces of the contours of the one or radio-frequency resonant patterns simultaneously while producing the plurality of holes.

2. The method according to claim 1, wherein the contours of the one or more radio-frequency resonant patterns are at least one of bars, spirals, and diverse shapes.

3. The method according to claim 1, wherein the one or more radio-frequency resonant patterns provide planar high-frequency filters operating in the band 10 MHz to 10 GHz.

* * * * *